United States Patent
Yokoyama

(10) Patent No.: US 9,040,229 B2
(45) Date of Patent: May 26, 2015

(54) MASKLESS PROCESS FOR PRE-TILTING LIQUID CRYSTAL MOLECULES

(71) Applicant: Kent State University, Kent, OH (US)

(72) Inventor: Hiroshi Yokoyama, Hudson, OH (US)

(73) Assignee: KENT STATE UNIVERSITY, Kent, OH (US)

( * ) Notice: Subject to any disclaimer, the term of this patent is extended or adjusted under 35 U.S.C. 154(b) by 51 days.

(21) Appl. No.: 13/750,833

(22) Filed: Jan. 25, 2013

(65) Prior Publication Data

US 2014/0212798 A1   Jul. 31, 2014

(51) Int. Cl.
G02F 1/1337   (2006.01)
G03F 7/00    (2006.01)
G03F 7/20    (2006.01)

(52) U.S. Cl.
CPC ........ *G02F 1/133788* (2013.01); *G03F 7/0005* (2013.01); *G03F 7/2051* (2013.01)

(58) Field of Classification Search
CPC  G02F 1/133788; G03F 1/0005; G03F 1/2057
USPC .......................... 430/320, 321; 349/124, 129
See application file for complete search history.

(56) References Cited

U.S. PATENT DOCUMENTS

| | | | |
|---|---|---|---|
| 5,936,691 A | 8/1999 | Kumar et al. | |
| 6,652,111 B2 | 11/2003 | Suzuki et al. | |
| 7,413,317 B2 | 8/2008 | Solomon et al. | |
| 2002/0027631 A1 | 3/2002 | Saitoh et al. | |
| 2002/0145799 A1 | 10/2002 | Choi et al. | |
| 2005/0259203 A1* | 11/2005 | Kimura et al. | 349/124 |
| 2006/0119745 A1 | 6/2006 | Vitito | |
| 2006/0187547 A1 | 8/2006 | Fukuda | |
| 2011/0069296 A1 | 3/2011 | Gruner et al. | |
| 2012/0064441 A1* | 3/2012 | Tanaka | 430/5 |
| 2012/0154769 A1* | 6/2012 | Min et al. | 355/18 |

FOREIGN PATENT DOCUMENTS

| | | |
|---|---|---|
| JP | 2002-060517 A | 2/2002 |
| JP | 2004-029180 A | 1/2004 |
| JP | 2006-323060 A | 11/2006 |
| KR | 10-2006-0119745 A | 11/2006 |
| KR | 10-2009-0055914 A | 6/2009 |
| WO | WO 2010/137402 A1 * | 12/2010 |

OTHER PUBLICATIONS

Nakata et al., LP-3: Late-News Poster: Photoalignment Materials Based on •-(4-Chalconyloxy) Alkyl Groups Providing TN Alignment with Pretilt Angle by One-Step Exposure of Polarized Near-UV Light, JSR Corp., Mie, Japan, 1999.

* cited by examiner

*Primary Examiner* — John A. McPherson
(74) *Attorney, Agent, or Firm* — Innovation Counsel LLP

(57) ABSTRACT

A method of tilting liquid crystal molecules is presented. The method entails providing a substrate including a photoalignment layer on top of a layer of liquid crystal molecules. The photoalignment layer is exposed to patterned light that is incident on the substrate at a substantially normal angle. The patterned light is polarized in a polarization direction that is non-parallel to an incident surface of the substrate.

16 Claims, 9 Drawing Sheets

MASKLESS PROCESS FOR PRE-TILTING LIQUID CRYSTAL MOLECULES

FIELD OF INVENTIVE CONCEPT

The present disclosure relates generally to display devices and particularly to liquid crystal displays.

BACKGROUND

Liquid crystal displays are widely used today in various devices and applications. Typically, a liquid crystal display includes electrodes that form an electric field upon receiving a voltage, and a layer of liquid crystal molecules that are controlled by the electric field. More specifically, the dielectric anisotropy of the liquid crystal molecules makes it possible to change the orientation of the liquid crystal molecules by controlling the electric field.

Liquid crystal molecules may tilt in response to an electric field. Uniform brightness is achieved in the end device when the liquid crystal molecules tilt in the same direction. If the liquid crystal tilt direction is not uniform, the brightness of the end device may be compromised, affecting the image quality. To avoid non-uniform brightness, a pre-tilt angle is achieved for the molecules. The pre-tilt angle typically falls within a given range. If the pre-tilt angle is too high, the birefringence due to the pre-tilt of the molecules will cause a light leakage in the dark state, reducing contrast ratio. If the pre-tilt angle is too low (e.g., less than 0.5 degrees), the molecules may tilt in diametrically opposite directions when a voltage is suddenly applied.

A desired pre-tilt may be achieved by a number of methods, such as oblique photoalignment. Oblique photoalignment sets the alignment direction and angle of liquid crystal molecules by irradiating an alignment layer at an oblique angle with light that is polarized perpendicularly to the direction of the beam. The oblique photoalignment technique, however, has drawbacks due to the unconventional geometry of the optical setup and the photolithography that cause problems such as nonuniform light intensity, shadow effects by patterning masks, and surface roughness.

A method of achieving uniform pre-tilt in liquid crystal molecules is desired.

SUMMARY

In one aspect, the disclosure includes a method of tilting liquid crystal molecules. The method entails providing a substrate including a photoalignment layer on top of a layer of liquid crystal molecules, and exposing the photoalignment layer to patterned light that is incident on the substrate at a substantially normal angle. The patterned light is polarized in a polarization direction that is non-parallel to an incident surface of the substrate.

In another aspect, the disclosure includes a method of tilting liquid crystal molecules by providing a substrate including a photoalignment layer on top of a layer of liquid crystal molecules, and directing light at the photoalignment layer at a substantially normal angle of incidence. The light is directed at the photoalignment layer non-continuously such that light and absence of light alternate on a spot of the photoalignment layer, wherein the light is polarized in a polarization direction that is non-parallel to an incident surface of the substrate.

DETAILED DESCRIPTION

The disclosure includes a maskless photo-rubbing process whereby patterned light is beamed onto a liquid crystal panel coated with photoalignment material. The light is polarized in a direction that forms an angle to both the surface of the panel and to the direction of the light beam. The light is directed at the panel so that it is incident on the panel at a substantially normal angle. The maskless photo-rubbing process achieves pre-tilting of the liquid crystal molecules.

Figure 1:
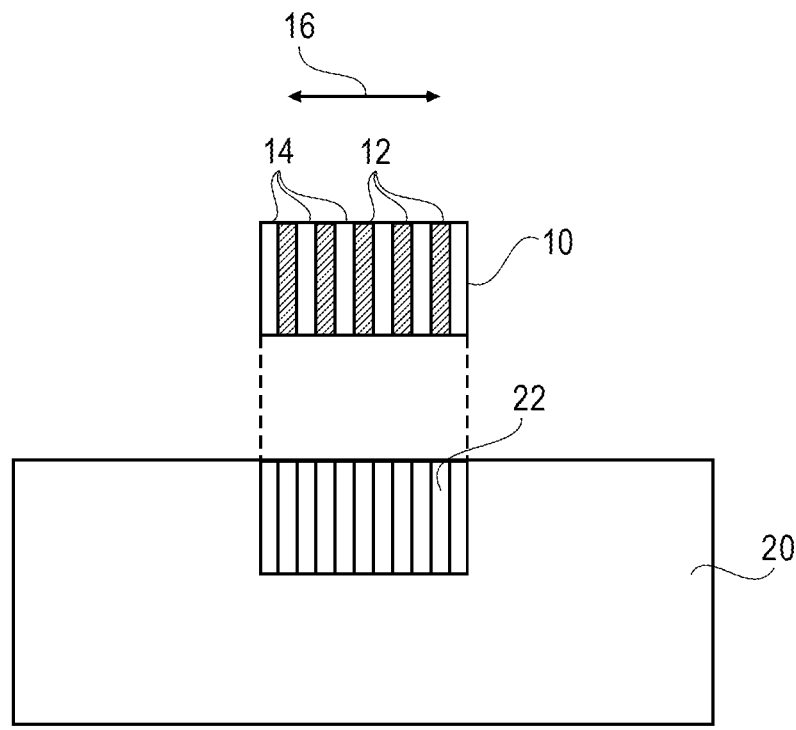
FIG. 1 depicts a maskless pre-tilting process in accordance with the inventive concept.

FIG. 1 depicts a maskless pre-tilting process in accordance with the inventive concept. As shown, a patterned light 10 is beamed onto a substrate 20, which is a liquid crystal panel that is coated with a photoalignment material. The patterned light 10 has dark portions 12 and bright portions 14. In the particular embodiment shown, the dark portions 12 and the bright portions 14 form a linear "slit" pattern whereby the bright portions 14 form "slits." The light 10 may be ultraviolet light that is polarized in a direction 16 that is substantially perpendicular to the length of the slits and non-parallel to the surface of the substrate 20. Besides ultraviolet light, any wavelength range to which the photoalignment material reacts may be suitable. The light 10 may be an asymmetrical or extended Laguerre beam that is irradiated onto the substrate 20 at a substantially orthogonal angle.

A patterned light generator may be used to irradiate the substrate 20 with the desired pattern. The patterned light illuminates less than all of the substrate 20, such that there is an illuminated area 22 that is smaller than the surface area of the substrate 20. The slits may be about 5 μm wide, giving the pattern a 10-μm pitch. As will be explained in more detail below, the substrate 20 and/or the patterned light 10 may be moved relative to each other to pre-tilt the liquid crystal molecules beneath the surface of the substrate 20.

Figure 2:
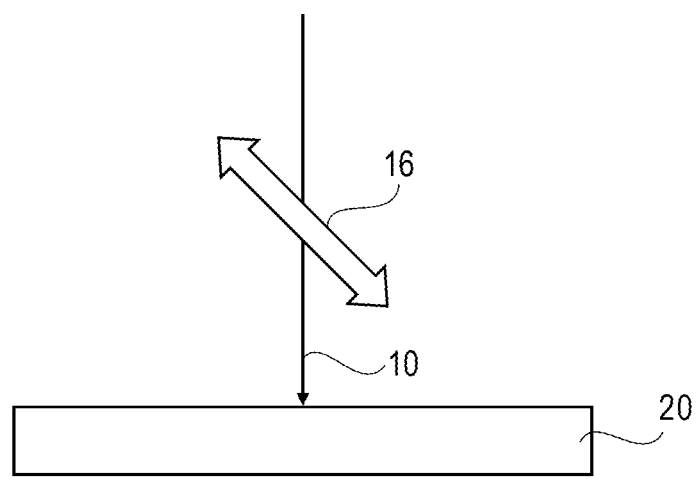
FIG. 2 depicts a side view of the maskless pre-tilting process in accordance with the inventive concept.

FIG. 2 depicts a side view of the maskless pre-tilting process in accordance with the inventive concept. As shown, the light 10 strikes the incident surface of the substrate 20 at a substantially normal angle. The light 10 is polarized in the direction 16, which is non-parallel to the surface of the substrate 20, and also non-parallel to the direction in which the light 10 is beamed. As mentioned above, the polarization direction 16 is substantially perpendicular to the length of the slits in the light pattern. As a consequence, the polarization direction 16 is substantially perpendicular to the boundary between the dark and bright portions 12, 14. In some embodiments, the illuminated area 22 may scan across the substrate surface to achieve the desired tilt angle. In some embodiments, optical methods may be used to control or achieve the desired tilt angle.

Figure 3:
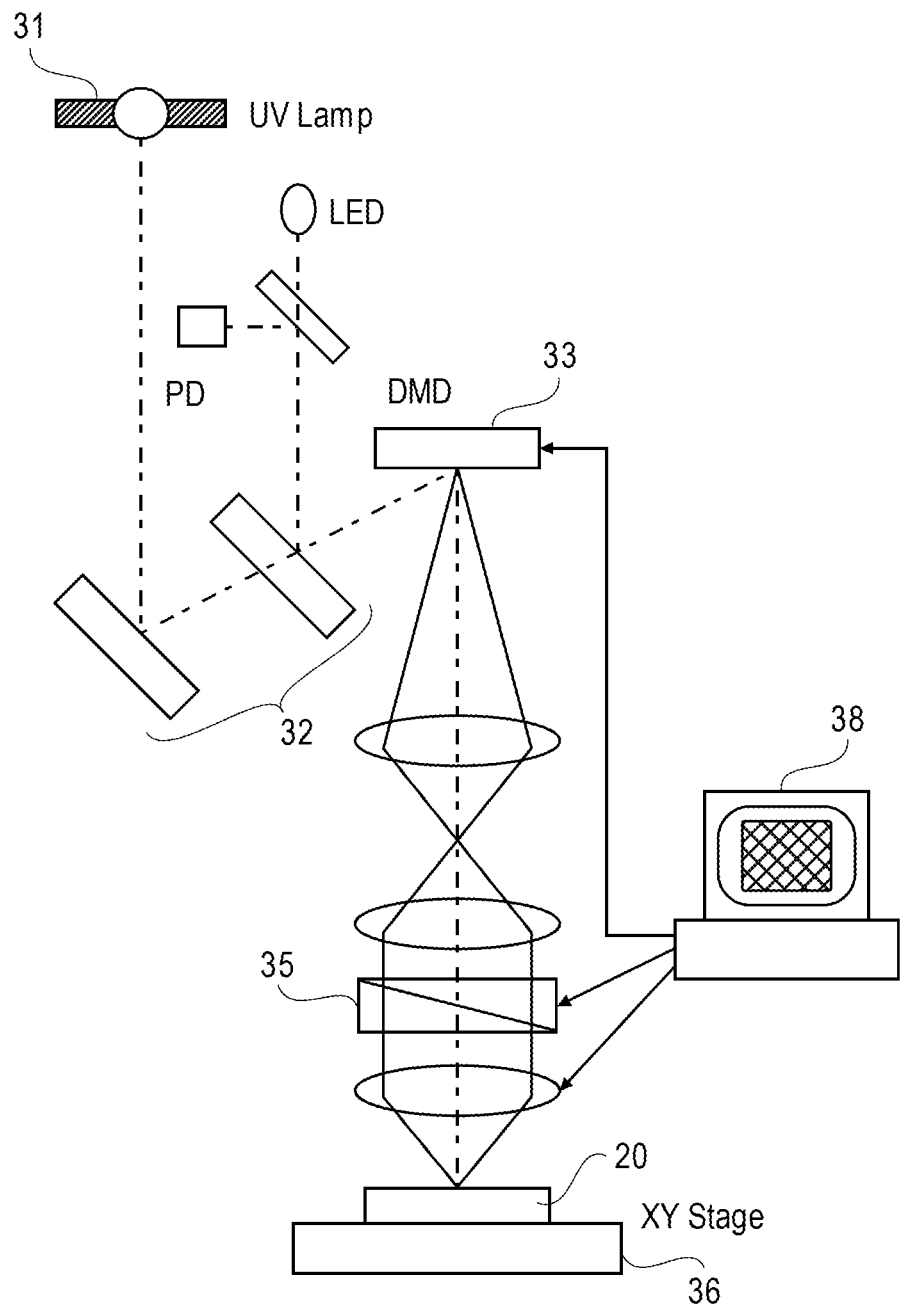
FIG. 3 depicts an exemplary apparatus that may be used to execute the maskless pre-tilting process of FIGS. 1 and 2.

FIG. 3 depicts an exemplary apparatus that may be used to execute the maskless pre-tilting process of FIGS. 1 and 2. In the setup that is shown, light 10 from a UV lamp 31 is directed toward a digital micro-mirror device (DMD) 33 via a set of reflective elements 32. The DMD 33, controlled by a computer 38, creates the light 10 of a desired pattern by using a motor-driven polarizer 35. The patterned light is then directed to the substrate 20 resting on an X-Y stage 36. The rotation of the polarizer 35 is synchronized with the pattern in the light 10. The computer 38 also controls the resolution of the pattern in the light 10. The DMD 33, the motor-driven polarizer 35, and the peripheral optical elements pattern the linearly polarized light 10 down to the micrometer dimension. The pattern may be changed by using the computer 38.

Figure 4:
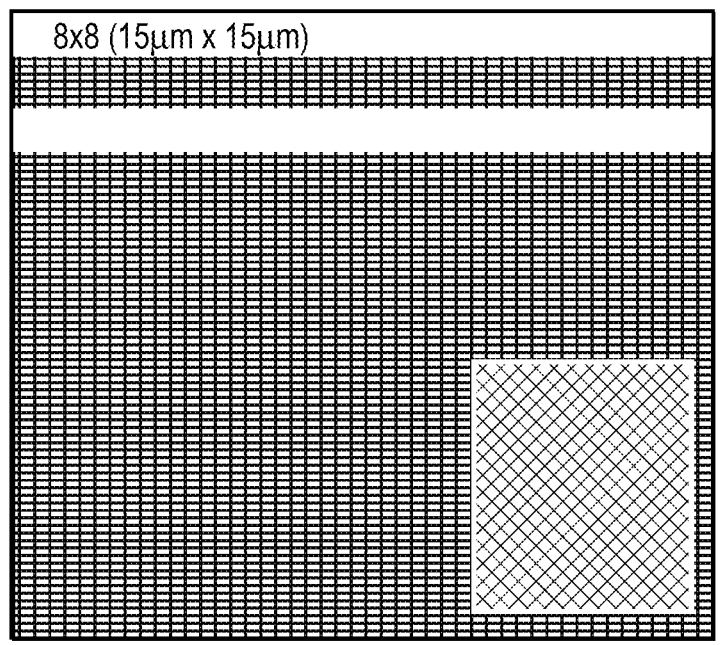
FIG. 4 depicts a square pattern that may be used for patterned light in accordance with the inventive concept.
Figure 5:
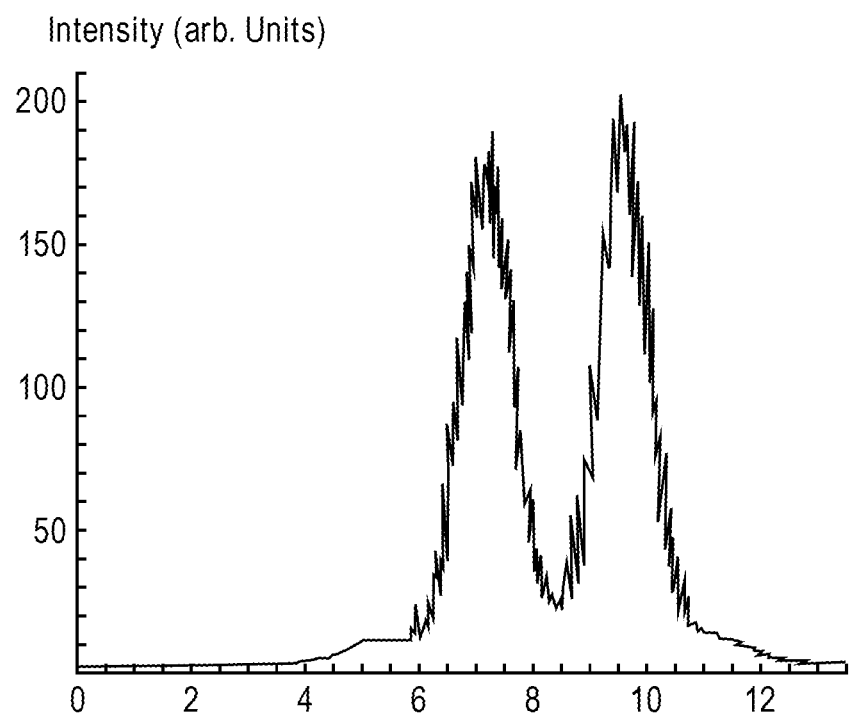
FIG. 5 is a plot of intensity as a function of position in the patterned light.

FIG. 4 depicts a square pattern that the computer 38 may create in the light 10. As shown, the square pattern may include light and dark regions arranged in a checkerboard pattern. FIG. 5 is a plot showing the intensity of light as a function of distance along a line traversing a portion of the square pattern. The high-intensity peaks in the plot correspond to the light regions in the checkerboard of FIG. 4, and the low-intensity parts of the plot correspond to the dark regions in the checkerboard.

Using a NA 0.4 objective lens as one of the optical elements, the resolution of the patterned light at the wavelength of 360 nm may be as good as 2.5 μm. The efficiency of the photo-rubbing is a function of the resolution. The intensity of linearly polarized ultraviolet light at the substrate surface may be about 10 mW/cm$^2$ when the illuminated area 22 has a size of about 2.0 mm×1.5 mm. The ultraviolet light throughput may be increased at least by a factor of 10 by using ultraviolet-compatible optical elements. With the particular apparatus, the light 10 stays in a fixed position while the substrate 20 is moved in the x- and y-directions to produce the desired tilt angle(s) for the liquid crystal molecules.

Figure 6:
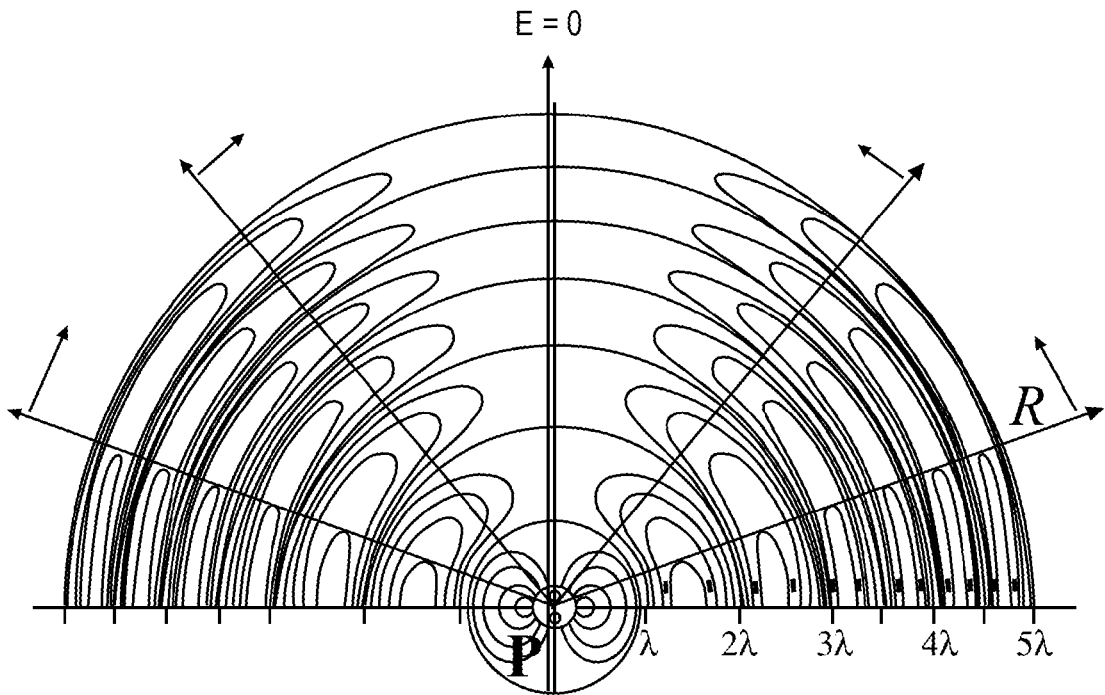
FIG. 6 and FIG. 7 depict symmetrical Laguerre beams.
Figure 7:
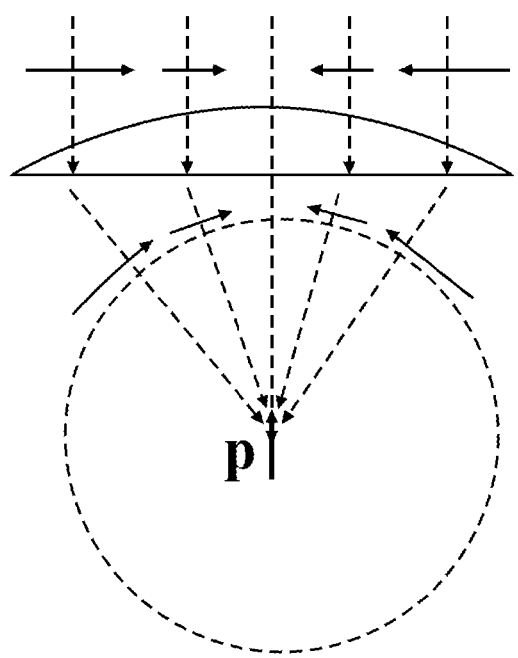
Figure 8:
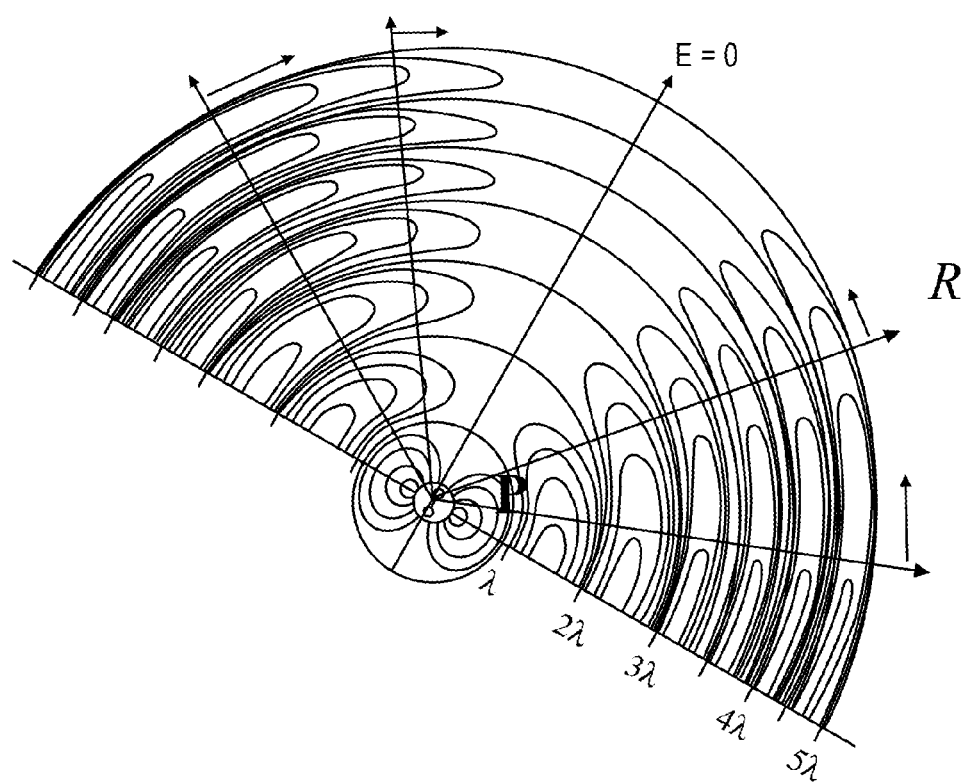
FIG. 8 and FIG. 9 depict asymmetrical Laguerre beams.
Figure 9:
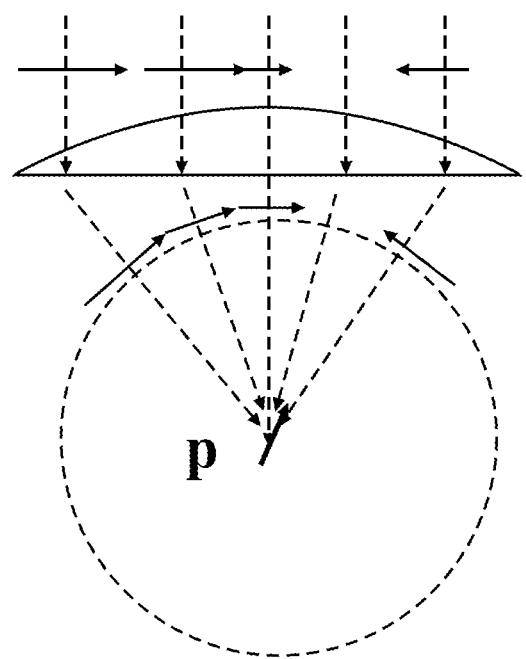

Extended or asymmetrical Laguerre beam may be used for the irradiation. Referring to FIGS. 6 and 8, the electric field vector at a point R from the center is:

$$E = \frac{(k^2)(e^{ikR})}{4\pi\varepsilon R^3}[(p \times R) \times R],$$

where p is the electric dipole at the center, R is the radial wave vector, and ∈ is the permittivity of vacuum. On the sphere at equal distance from the center dipole, the phase of the wave is constant. The polarization and the intensity of the electric vector vary according to the above expression. In particular, on the radial axis parallel to the dipole, the intensity is zero. In the ordinary Laguerre beam illustrated in FIG. 6 and FIG. 7, the incoming light has the same polarization and intensity distribution as the divergent dipole radiation, with the optic axis of the system coaxial with the dipole on a converging spherical wave front. In one embodiment, an asymmetric/extended Laguerre beam such as that depicted in FIG. 8 and FIG. 9 is generated by DMD 33. A symmetric Laguerre beam may become asymmetric when it passes the polarizer 35.

The same scheme may be applied for generating a tilted electric dipole at the focal point even under the normal incidence. The asymmetrical Laguerre beam (or extended Laguerre beam), applied at normal angle to the substrate surface, excites the photoalignment material, thereby generating a selected pre-tilt angle.

Figure 10:
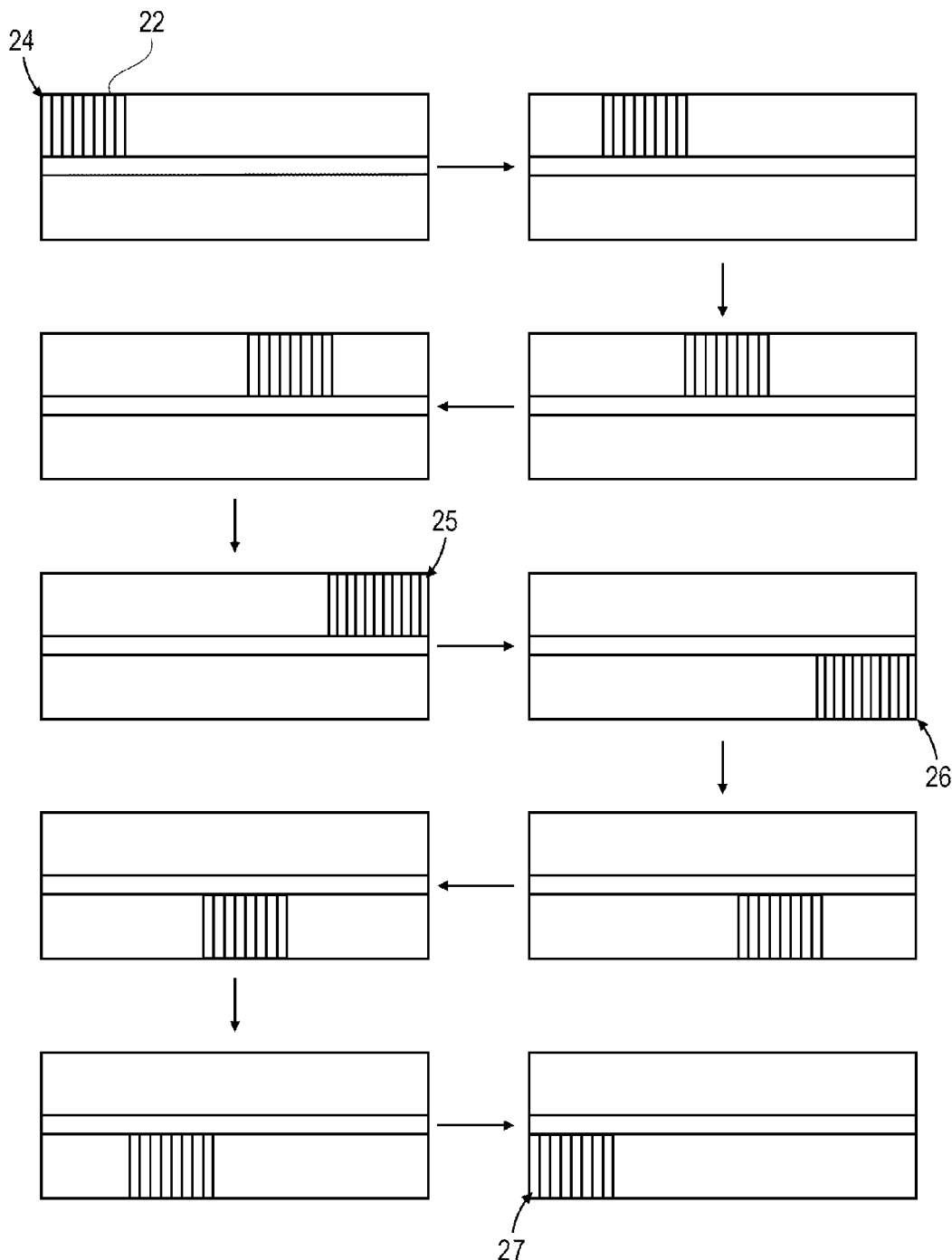
FIG. 10 illustrates how the light may be moved over the substrate to achieve different domains of pre-tilt.

FIG. 10 illustrates how the light 10 can be moved over the substrate 20 to achieve different domains of pre-tilt directions. The method illustrated in FIG. 5 may be suitable for vertical alignment (VA) mode liquid crystal displays, although this is not a limitation of the inventive concept. In a VA mode liquid crystal display, the longitudinal axes of the liquid crystal molecules are aligned substantially perpendicularly with respect to the substrates in the absence of an electric field. In VA mode, the liquid crystal molecules can tilt with their director in any plane that is perpendicular to the substrate. For situations with partial tilt, this would lead to domains with varying retardation under oblique angles and therefore, varying and uncontrolled contrast. Hence, in order to obtain a symmetrical viewing angle, a pixel is subdivided into domains, each domain having a different pre-tilt direction.

Referring to FIG. 10, where the light 10 is scanned across the surface of the substrate 20, the pre-tilt direction of the liquid crystal molecules depends on the direction in which the light 10 moves. The light 10 is directed at the substrate 20 at a normal angle throughout the scanning process. If the light 10 moves across one section of the substrate 20 in a first direction and another section of the substrate 20 in a second direction, the liquid crystal molecules in the two domains will have different tilt directions.

Initially, the light 10 is positioned such that the illuminated area 22 is at the upper left corner of the substrate 20. Then, either the substrate 20 or the light 10 is moved such that the illuminated area 22 moves to the right, eventually crossing all the way over to the upper right corner of the substrate 20 as shown. Then, the illuminated area 22 moves to the lower right corner 26 to traverse a segment that was not previously covered, and moves linearly leftward until it is at the lower left corner 27. As the illuminated area 22 moved from left to right in the upper portion of the substrate 20, the liquid crystal molecules in the upper portion will be tilted at a first angle. The lower portion, where the illuminated area 22 moved from right to left, will be tilted at a different angle than the first angle. If a finite tilt angle is generated, it is visible as a defect-like orientational structure at the gap between the upper and lower portions. The upper portion of the substrate 20 having a first pre-tilt direction and the lower portion having a second pre-tilt direction form different domains on the substrate 20.

The number of times the boundary between the bright regions 14 and the dark regions 12 passes on a surface before completion of the photoreaction with the coating material affects the resulting pre-tilt angle. Hence, the light 10 may be scanned across the same substrate surface repetitively until the substrate 20 has been passed by the dark-bright boundary the desired number of times. The pre-tilt angle may be adjusted by controlling the pitch of the dark-bright pattern in the light and/or the scanning speed. The narrower the dark portion and bright portions of the light 10, the higher the efficiency at which pre-tilt is generated (i.e., saturation is reached sooner).

When the illuminated area 22 moves from the upper right corner 25 to the lower right corner 26, the direction of its movement is parallel to the length of the slits. Hence, no pre-tilt is achieved by that parallel movement.

Figure 11:
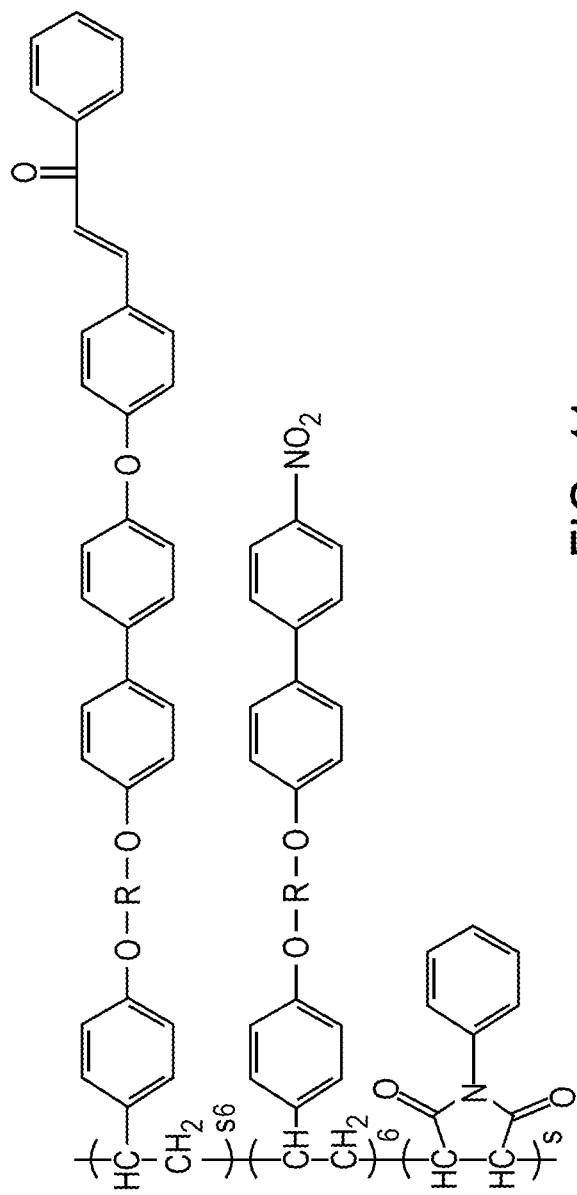
FIG. 11 shows the chemical structure of a chalcon-based photoalignment material that may be used for the maskless pre-tilting process of the inventive concept.
Figure 12:
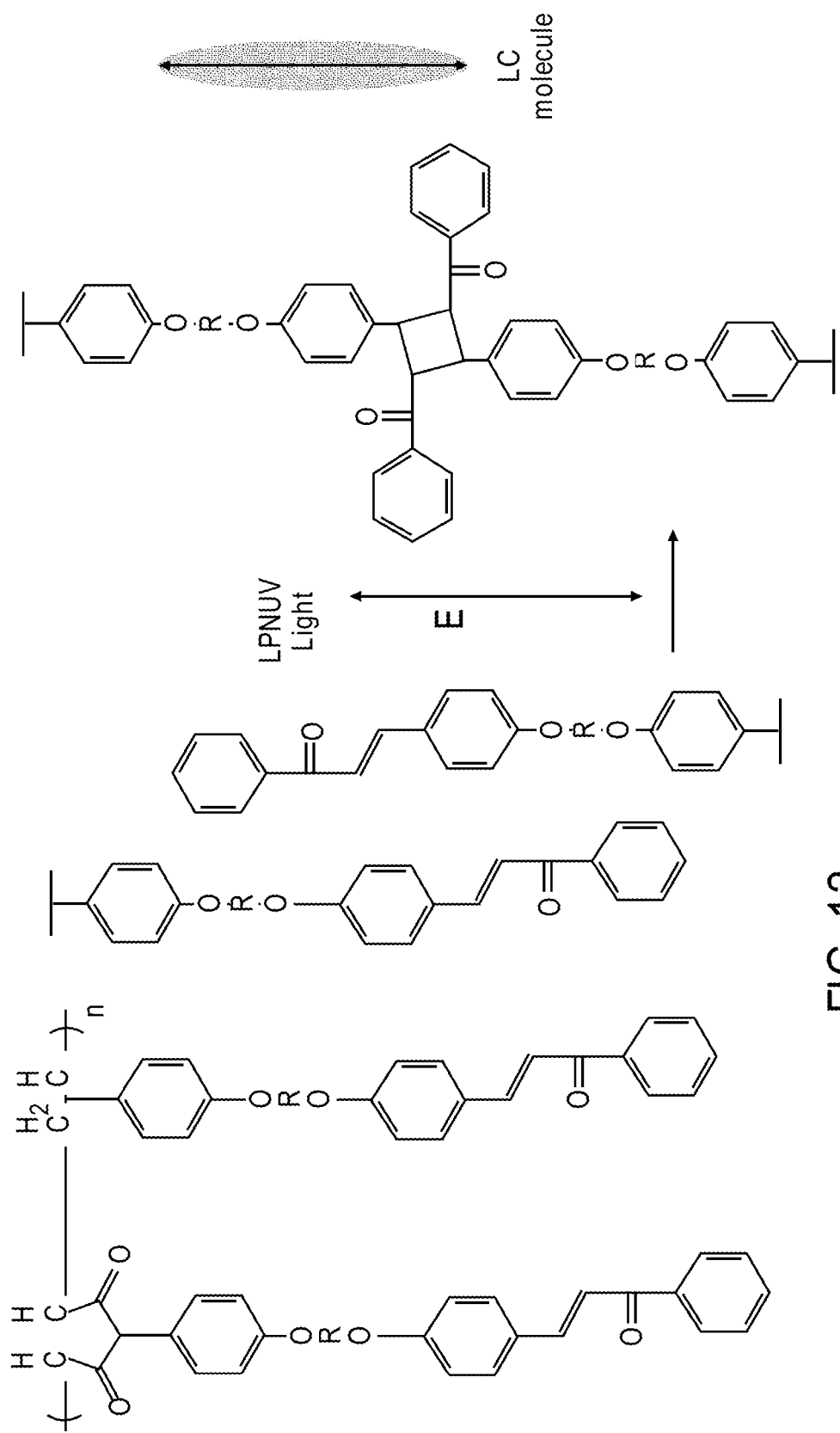
FIG. 12 shows the chemical structure of PMI-15 made by JSR, which may be used as the photoalignment material for the maskless pre-tilting process of the inventive concept.

As mentioned above, the substrate 20 is coated with a photoalignment material for the photoreaction to occur. The photoalignment material may be spin-coated on the panel. The photoalignment material may be a chalcon-based photoalignment material having the structure shown in FIG. 11, or a polymer based on ω(4-Chalconyloxy) Alkyl group of the type shown in FIG. 12 and referred to herein as PMI-15 made by JSR. Chemical structures of the two materials are shown in FIG. 11 and FIG. 12.

Table 1 summarizes the pre-tilt angles that are generated with different coating materials. To obtain the results shown in Table 1, experiments were performed at the wavelength of 360 nm and substrate surface intensity of 10 mW/cm$^2$. The scan rate was varied such that the total dose of ultraviolet energy was achieved after the passage of 100-1000 bright-dark boundaries.

TABLE 1

Tilt Generation Achieved with Different Coating Materials

|  | Pre-Tilt Angle that is Generated | Sensitivity (J/cm$^2$) | UV Band (nm) |
| --- | --- | --- | --- |
| PMI-15 | 1-5 | 1-5 | 360 |
| PROP-1 (Planar) | 1-3 | 0.5-1 | 360 |
| PROP-2 (Planar) | 1-2 | Unknown | <300 |
| PROP-3 (VA) | >0 | Unknown | <300 |
| PROP-4 (VA) | >0 | Unknown | <300 |

Materials described as PROP-1 through PROP-4 are proprietary materials provided by JSR. The materials may include a UV-reactive substance. The indicator "planar" and "VA" refers to the operational mode of the liquid crystals. The nematic liquid crystals that may be used include Merck's E7, 5CB, MLC-2132, MLC-3008, and MLC-3017.

With PMI-15, the photoreaction was achieved at a wavelength of about 365 nm. Anisotropy is formed parallel to the polarization axis of Linear Polarized Ultra Violet (LPUV) light, and liquid crystal alignment is obtained parallel to the polarization axis.

Overall, the maskless photorubbing is effective for generating finite tilt angles for both planar and vertical alignment materials. As previously mentioned, the number of times the boundary between the bright regions 14 and the dark regions 12 passes on a surface before completion of the photoreaction with the coating material and the polarization direction of the light 10 affect the resulting pre-tilt angle. The light-energy dose for JSR's PMI-15 is 1-5 J/cm$^2$ at a wavelength of 360 nm and allows a wide range of control of the scan speed. Materials such as PROP-1, PROP-2, PROP-3, and PROP-4 may be more sensitive than PMI-15, and would be used at a higher scanning speed and possibly with finer patterns to establish the appropriate number of passage. In obtaining the data presented in Table 1, the stage speed was adjusted to cover the range of 10-1000 passages before the alleged dose is reached.

In the disclosure herein, pre-tilt is achieved by a bright spot and a dark spot passing over the photoalignment material. It should be understood that the disclosed concept can be practiced with modification and alteration within the spirit and scope of the disclosure. For example, pre-tilting may be achieved by controlling the bright and dark spots such that they have a similar effect as if they are being physically scanned across the photoalignhment material, without physically passing the illumination area across a surface. The description is not intended to be exhaustive or to limit the disclosure to the precise form disclosed.

What is claimed is:

1. A method of tilting liquid crystal molecules, the method comprising:
    providing a substrate including a photoalignment layer on top of a layer of liquid crystal molecules;
    apportioning the photoalignment layer into a plurality of longitudinal regions; and
    exposing the photoalignment layer to a patterned light one longitudinal region at a time such that the patterned light moves across a longitudinal region in a first direction along its length, then moves to an adjacent longitudinal region in a second direction perpendicular to the first direction, and then moves across the adjacent horizontal region in a direction opposite to the first direction,
    wherein the patterned light has a pattern including dark areas and bright areas, the patterned light being polarized in a polarization direction that is non-parallel to an incident surface of the substrate, wherein the patterned light is incident on the substrate at a substantially normal angle.

2. The method of claim 1, wherein the pattern comprises alternating lines of dark areas and bright areas.

3. The method of claim 2 further comprising controlling a pretilt angle of the liquid crystal molecules by adjusting a pitch of the pattern.

4. The method of claim 1, wherein the photoalignment layer is a photoreactive polymer.

5. The method of claim 1, wherein the patterned light is polarized in a polarization direction that is perpendicular to a boundary between the dark areas and bright areas.

6. The method of claim 1, further comprising moving the patterned light on the photoalignment layer repetitively until the boundary between the bright areas and the dark areas passes on a section of the photoalignment layer a selected number of times.

7. The method of claim 1 further comprising controlling a pretilt angle of the liquid crystal molecules by adjusting a speed at which the patterned light is moved across the photoalignment layer.

8. The method of claim 1, wherein the polarization direction of the patterned light is non-parallel and non-perpendicular to the main propagation direction of the patterned light.

9. The method of claim 1 further comprising creating the pattern with a digital micro-mirror device and a computer.

10. The method of claim 1, wherein the patterned light is ultraviolet light.

11. A method of claim 1, wherein a width of the pattern light in the second direction is equal to a width of each of the longitudinal regions.

12. A method of tilting liquid crystal molecules, the method comprising:
    providing a substrate including a photoalignment layer on top of a layer of liquid crystal molecules; and
    exposing the photoalignment layer to a patterned light, wherein the patterned light has a pattern including dark areas and bright areas, the patterned light being polarized in a polarization direction that is non-parallel to an incident surface of the substrate, wherein the patterned light is incident on the substrate at a substantially normal angle, and wherein the light is an extended Laguerre beam.

13. A method of tilting liquid crystal molecules, the method comprising:
    providing a substrate including a photoalignment layer on top of a layer of liquid crystal molecules;
    apportioning the photoalignment layer into a plurality of longitudinal regions; and
    directing light at the photoalignment layer at a substantially normal angle of incidence and non-continuously such that light and absence of light alternate on a spot of the photoalignment layer, wherein the light is polarized in a polarization direction that is non-parallel to an incident surface of the substrate, and wherein the light moves across a longitudinal region in a first direction along its length, then moves to an adjacent longitudinal region in a second direction perpendicular to the first direction, and then moves across the adjacent horizontal region in a direction opposite to the first direction.

14. The method of claim 13, wherein directing the light non-continuously comprises scanning a patterned light across the photoalignment layer, the patterned light having bright portions and dark portions.

15. A method of claim 13, wherein a width of the light in the second direction is equal to a width of each of the longitudinal regions.

16. A method of tilting liquid crystal molecules, the method comprising:
   providing a substrate including a photoalignment layer on top of a layer of liquid crystal molecules; and
   directing light at the photoalignment layer at a substantially normal angle of incidence and non-continuously such that light and absence of light alternate on a spot of the photoalignment layer, wherein the light is polarized in a polarization direction that is non-parallel to an incident surface of the substrate, and wherein the light is an extended Laguerre beam.

* * * * *